United States Patent [19]

Krafcsik et al.

[11] Patent Number: 5,334,959
[45] Date of Patent: Aug. 2, 1994

[54] 180 DEGREE PHASE SHIFTER BIT

[75] Inventors: David M. Krafcsik, Glen Burnie; David W. Chan, Beltsville, both of Md.

[73] Assignee: Westinghouse Electric Corporation, Pittsburgh, Pa.

[21] Appl. No.: 46,323

[22] Filed: Apr. 15, 1993

[51] Int. Cl.⁵ ............................................. H01P 1/18
[52] U.S. Cl. .................................. 333/164; 333/156; 333/109
[58] Field of Search ............... 333/109, 116, 117, 161, 333/164, 156

[56] References Cited

U.S. PATENT DOCUMENTS

| | | | |
|---|---|---|---|
| 3,778,733 | 12/1973 | Rizzi | 333/139 |
| 4,612,520 | 9/1986 | Boire et al. | 333/156 |
| 4,682,118 | 7/1987 | Thiel | 329/122 |
| 4,733,203 | 3/1988 | Ayasli | 333/139 |
| 4,893,035 | 1/1990 | Reynolds et al. | 307/520 |
| 4,961,062 | 10/1990 | Wendler | 333/164 |
| 4,963,773 | 10/1990 | Ayasli | 307/511 |
| 4,999,593 | 3/1991 | Anderson | 333/116 X |
| 5,039,873 | 8/1991 | Sasaki | 333/164 X |
| 5,045,731 | 9/1991 | Riddle | 307/511 |
| 5,119,050 | 6/1992 | Upshur et al. | 333/164 |

OTHER PUBLICATIONS

Miley, "Looking for a 3 to 8db Microstrip Coupler?", Microwaves vol. 13, No. 3, Mar. 1974, pp. 58–62.
"4.5 to 18 GHz Phase Shifter" by D. C. Boire, J. E. Degenford and M. Cohn, published in IEEE MTT-S Digest, pp. 601–604 1985.
"Monolithic 6–18 GHz 3 Bit Phase Shifter" by M. J. Schindler, Y. Ayasli, A. M. Morris and L. K. Hanes published in IEEE GaAs IC Symposium, 1985. pp. 129–132.
"A Compact Broadband, Six-Bit MMIC Phasor With Integrated Digital Drivers" by Christopher Moye, Glenn Sakamoto and Michael Brand, published in IEEE Microwave and Millimeter Wave Monolithic Circuits Symposium, 1990. pp. 123–126.

*Primary Examiner*—Seungsook Ham
*Attorney, Agent, or Firm*—Eugene LeDonne

[57] ABSTRACT

An improved 180° phase shifter bit that uses embedded switches to selectively connect the RF input and RF output to a loosely coupled transmission line segment and a pi section of transmission line. A hybrid coupler is selected having characteristic impedance of less than 50 ohms and having coupling of less than −3 db. The result of this coupling choice is extremely low insertion loss. The resultant impedance mismatch is compensated for by providing oversized field effect transistors that allow RF signal in both the grounded coupler and the pi section of transmission lines that are 180° out of phase. The RF signal present in both the coupler and pi section of the transmission line results in a cancellation effect allowing recovery of the input/output impedance over an approximately one octave bandwidth.

9 Claims, 2 Drawing Sheets

180 DEGREE PHASE SHIFTER BIT

BACKGROUND OF THE INVENTION

1. Field of the Invention

This invention relates generally to radio frequency phase shifting circuits and more particularly to a radio frequency circuit that provides a 180° phase shift to a signal propagated therethrough.

2. Description of the Prior Art

Phase shifters are devices in which the phase of an electromagnetic wave of a given frequency propagating through a transmission line can be shifted. Such phase shifters are utilized in many microwave systems and in particular are required for electronic beam steering and phased array radar systems. A typical prior art wide band 180° phase shifter bit is constructed by placing switching diodes of the coupled and through ports of a branch line or Lange coupler. By switching the diodes off and on, the signal appearing at the output ports of the coupler exhibit a relative 180° phase shift. Such a phase shifter is limited to generally less than an octave bandwidth and microwave frequency because of phase shift deviations from the desired 180°.

Other types of phase shifters are found in the prior art in which a change in phase is obtained by utilizing one of a number of lengths of transmission line to approximate the desired value of phase change. Various lengths of transmission line are inserted and removed by high speed electronic switching. Semiconductor diodes and ferrites are the devices commonly employed in digital phase shifters. One such digitally switched phase shifter is a parallel line configuration in which the proper transmission line segment is selected from among many available parallel lines. An alternative phase shifter is a series line or a cascaded multi-bit digitally switched phase shifter.

Another type of phase shifter is described in U.S. Pat. No. 4,612,520 to Boire et al. This phase shifting bit utilized switching means to alternatively connect the RF input and RF output to a coupled transmission line segment and a pi network segment. However, when a standard −3 db, 50 ohm coupler is utilized in this design to achieve a wide bandwidth, the circuit experiences relatively high (approximately 3 to 4 db) insertion loss. This is because this design requires very small series switches in order to keep the capacities of the switches small so that no RF signal will travel through the "off" path of the circuit. And if different coupling or impedance is chosen, a VSWR mismatch develops.

SUMMARY OF THE INVENTION

We provide an improved 180° phase shifter bit for providing a flat phase shift over a relatively narrow (approximately one octave wide) bandwidth. The present phase shifter bit uses embedded switches to selectively connect the RF input and RF output to a coupled transmission line segment and a pi section of transmission line. A hybrid coupler is selected having characteristic impedance of less than or equal to 50 ohms (preferably in the range of 30 to 50 ohms) and having coupling of less than −3 db (preferably in the range of −3½ db to −10 db). The result of this coupling choice is extremely low insertion loss.

However, the use of a coupler having less than 50 ohm characteristic impedance and less than −3 db coupling results in an impedance mismatch. This is compensated for in the present phase shifter bit by providing field effect transistor switches that are greatly increased in size so as to allow RF signal in both the grounded hybrid coupler and the pi section of transmission lines that are 180° out of phase. The RF signal being present in both the coupler and the pi section of transmission lines results in a cancellation effect that causes the RF signal in both signal paths to have different magnitudes and allows some recovery of the input/output impedance. The use of oversized field effect transistor switches also further reduces insertion loss in the circuit.

Other objects and advantages of the invention will become apparent from a description of certain present preferred embodiments thereof shown in the drawings.

DESCRIPTION OF THE PREFERRED EMBODIMENTS

Figure 1:
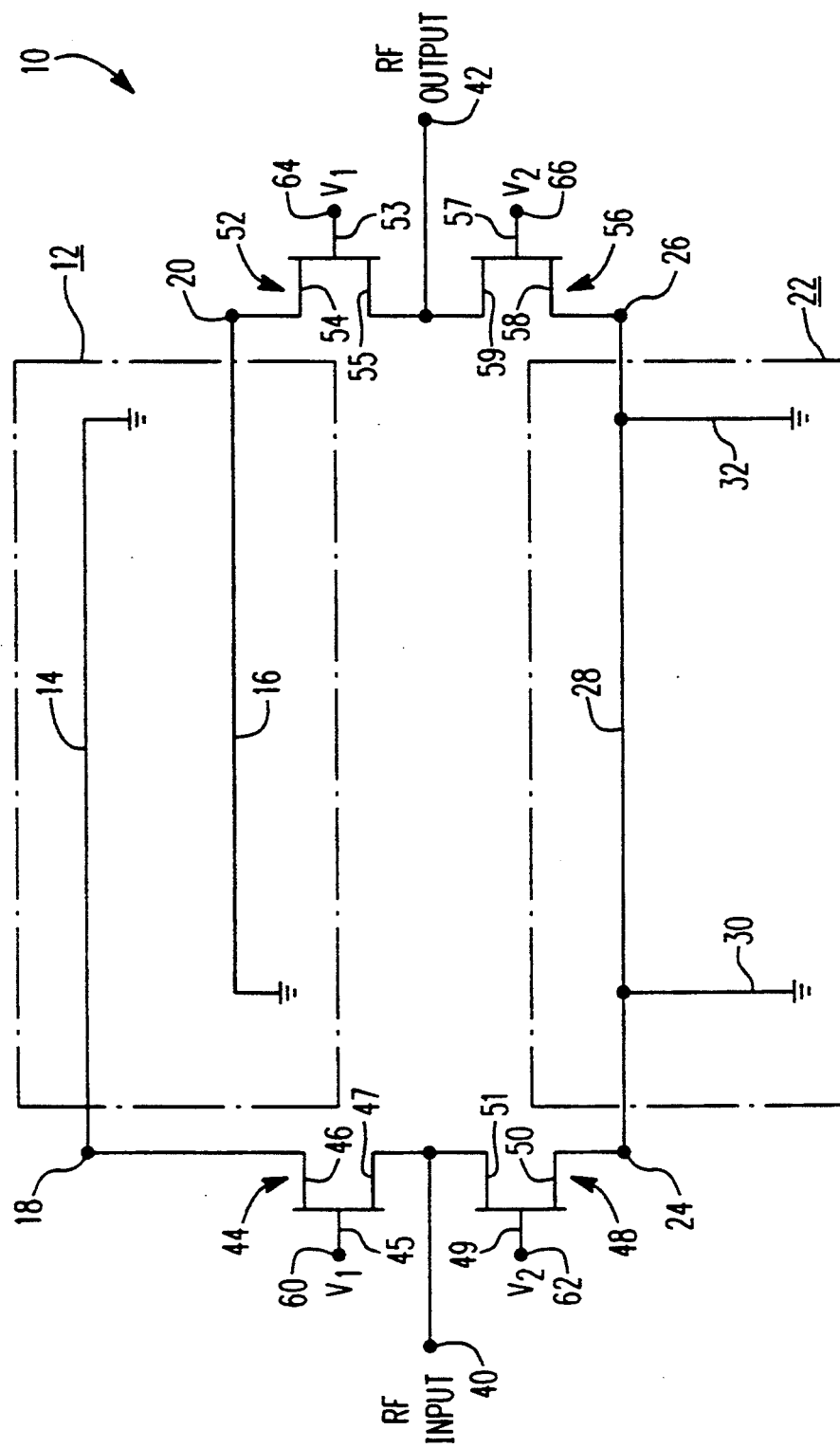
FIG. 1 is a schematic diagram of the present preferred phase shifter bit.

The 180° phase shifter bit of the present invention is illustrated in schematic fashion in FIG. 1. The phase shifter bit 10 comprises a first transmission line portion 12 of coupled transmission line segments 14 and 16 of equal electrical length. Opposed ends of each transmission line terminate in terminals 18 and 20, while the other end of each transmission line is grounded. The coupled line portion 12 is designed to have a coupling of less than −3 db. Suitable coupling for the purpose of this invention has been in the range of −3½ db to −10 db, however, the best results have been found with coupling of −5½ db. The characteristic impedance of the coupled line portion 12 is preferably in the range of 30 to 50 ohms with the preferred characteristic impedance being 40 ohms.

A second transmission line portion 22 is connected to terminals 24 and 26 and comprises a pi section of transmission line having a central line portion 28 having opposed ends from which extend grounded line portions 30 and 32 with the extending ends of the central line portion connected to terminals 24 and 26. The transmission lines portions 28, 30 and 32 are all of approximately equal electrical length and are also approximately equal to the electrical length of the coupled line segments 14 and 16.

A first and a second input field effect transistor 44 and 48 (each hereinafter referred to as an input FET) act as a switching means switchable between terminals 18 and 24. A first and a second output field effect transistor 52 and 56 (each hereinafter referred to as an output FET) act as a switching means switchable between terminals 20 and 26. Each FET having a gate, a source and a drain. The input FETs 44 and 48 are connected to the RF input terminal 40. The output FETs 52 and 56 are connected to RF output terminal 42. The input FETs 44 and 48 and output FETs 52 and 56 are operated together to switch respectively the RF input and RF output between the coupled line transmission portion 12 and the pi network transmission portion 22.

The coupled line transmission portion 12 and the pi network transmission portion 22 comprise two networks which are exactly equivalent for all frequencies with the exception that the transmission phase difference between the coupled line portion and the pi network portion is exactly 180°. The pi network is equivalent to the shorted coupled line portion preceded by an ideal phase reversing transformer. This result is independent of the electrical length of the transmission lines of the two networks and thus independent of frequency.

The input FETs and the output FETs alternatively connect the RF input and RF output to the coupled, shorted transmission line segments and thereafter to the pi section of transmission line, with these two networks behaving identically as band pass filters. The 180° phase shift obtained by switching between the shorted coupled line portion and the pi network portion of the phase shifter is obtained independent of the electrical length of the transmission line sections which make up the device. In this way, the transmission line sections can be of short length, i.e., substantially less than a quarter wavelength at the band center.

The 180° phase shifter bit of the present invention is to be implemented as a monolithic microwave integrated circuit. A substrate is used which preferably has deposited thereon strip line conductive material which makes up the transmission line portions of the phase shifter bit with hybrid circuit components mounted upon the substrate to complete the circuit.

The first input FET 44 has a source terminal 46 that is connected to the shorted, coupled transmission line portion 12. The first input FET 44 also has a drain terminal 47 that is connected to the RF input terminal 40. A gate terminal 45 of the first input FET is connected to bias control port 60. The second input FET 48 has a source terminal 50 that is connected to the pi section of transmission line 22. The second input FET 48 also has a drain terminal 51 that is connected to the RF input terminal 40. A gate terminal 49 of the second input FET is connected to bias control port 62.

The first output FET 52 has a source terminal 54 connected to the opposed end of the shorted, coupled transmission line portion 12. A drain terminal 55 of the first output FET 52 is connected to the RF output terminal 42. The first output FET 52 also has a gate terminal 53 that is connected to bias control port 64. The second output FET 56 has a source terminal 58 that is connected to the pi section of transmission line 22. A drain terminal 59 of the second output FET 56 is connected to the RF output terminal 42. The second output FET 56 also has a gate terminal 57 that is connected to bias control port 66.

The input and output FETs 52, 54, 56 and 58 are designed to be oversized so as to have a capacitance. The coupled line transmission line portion 12 in this embodiment is preferably made of micro-strip transmission line. The pi network 22 is also preferably comprised of microstrip transmission line. However, it is understood that the present phase shifter bit could be made of any suitable transmission line media such as strip line.

$V_1$ and $V_2$ represent first and second bias control voltages, respectively, for applying biasing potential to the gates of the switching FETs. Bias control voltage $V_1$ is applied to the input side of the circuit at bias control port 60 and to the output side of the circuit at bias control port 64. Bias control voltage $V_2$ is applied to the input side of the circuit at bias control port 62 and to the output side of the circuit at bias control port 66.

When the bias voltage applied at $V_1$ is 0 volts and the bias voltage applied at $V_2$ is a suitable negative voltage (which for the preferred circuit is $-5\frac{1}{2}$ volts) most of the signal will travel through the coupled transmission line portion 12. At this time, FETs 44 and 52 are "on", while the FETs 48 and 56 are "off". Even though FETs 48 and 56 are "off", a limited signal will still travel through the pi section of transmission line 22. This is because the FETs are physically large so that instead of behaving as an ideal open circuit, the FETs 52, 54, 56 and 58 are primarily capacitive when "off". Thus, the FETs 52, 54, 56 and 58 are designed to be sufficiently large so that the capacitance at the operable bandwidth still allows a certain amount of signal to travel through the pi section of transmission line 22 with a phase change.

Conversely, when the bias voltage applied at $V_2$ is 0 volts and the bias voltage applied at $V_1$ is a suitable negative voltage (which for the preferred circuit is $-5\frac{1}{2}$ volts) most of the signal will travel through the pi section of transmission line 22, as FETs 48 and 56 are now "on" while FETs 44 and 52 are "off". Again, because of the capacitancy of the "off" FETs, some of the signal will still travel through the coupler despite FETs 44 and 52 being "off". The limited signal traveling between the "off" FETs 44 and 52 will have a phase difference of 180° from the signal traveling between the "on" FETs 48 and 56, thus a cancellation effect occurs which reduces the impedance mismatch over an approximately one octave bandwidth.

Figure 2:
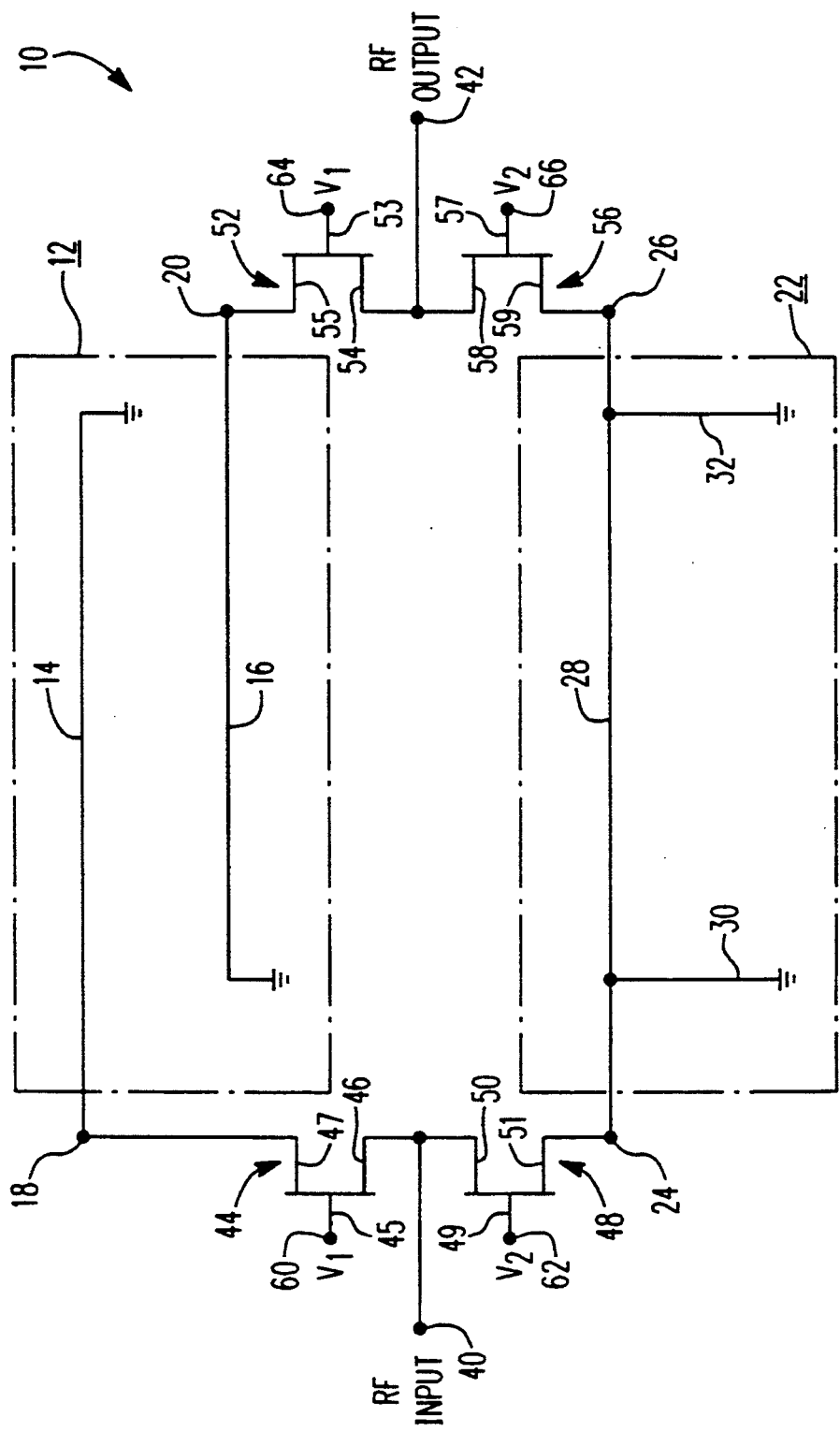
FIG. 2 is a schematic diagram of a variation of the present preferred phase shifter bit.

Variations of the preferred embodiment are possible. For example, it has been described to connect the respective source terminals of the input and output FETs to the shorted, coupled transmission line portion and pi section of transmission line. However, the drain terminals may be interchangeably selected for connection to the coupled transmission line and pi section of transmission line, as shown in FIG. 2.

While certain present preferred embodiments have been shown and described, it is distinctly understood that the invention is not limited thereto but may be otherwise embodied within the scope of the following claims.

We claim:

1. A 180° phase shifter bit operable independently of input signal frequency over a predetermined bandwidth of interest to produce a 180° phase shifted RF output signal, comprising:

(a) an RF input terminal;

(b) an RF output terminal;

(c) a coupled transmission line segment of two coupled lines having a coupling of less than $-3$ db and having a characteristic impedance of less than 50 ohms with opposed ends of each line of the coupled line segment being connected respectively to the RF input terminal and the RF output terminal with the other end of each line being grounded;

(d) a pi network transmission line segment having a central line portion having opposed ends from which extend grounded line portions, and the opposed ends of the central line portion are respectively connected to the RF input terminal and the RF output terminal;

(e) a first input FET having a gate, a source and a drain, the first input FET connecting the RF input terminal to the coupled line segment, the gate of the first input FET being connected to a bias port, one of the drain and the source of the first input FET being connected to the RF input terminal, and the other of the drain and the source of the first input FET being connected to the coupled line segment;

(f) a second input FET having a gate, a source and a drain, the second input FET connecting the RF input terminal to the pi network segment, the gate of the second input FET being connected to a bias port, one of the drain and the source of the second input FET being connected to the RF input terminal, and the other of the drain and the source of the second input FET being connected to the pi network segment;

(g) a first output FET having a gate, a source and a drain, the first output FET connecting the RF output terminal to the coupled line segment, the gate of the first output FET being connected to a bias port, one of the drain and the source of the first output FET being connected to the RF output terminal, and the other of the drain and the source of the first output FET being connected to the coupled line segment; and (h) a second output FET having a gate, a source and a drain, the second output FET connecting the RF output terminal to the pi network segment, the gate of the second output FET being connected to a bias port, one of the drain and the source of the second output FET being connected to the RF output terminal, and the other of the drain and the source of the second output FET being connected to the pi network segment;

wherein the input FETs and the output FETS have a capacitance such that a portion of the RF input signal will travel through one of the pi network segment and the coupled line segment when the RF input signal is switched through the other of the pi network segment and the coupled line segment.

2. The phase shifter bit of claim 1 wherein the coupled line segment has a coupling of between $-3\frac{1}{2}$ and $-10$ db and has a characteristic impedance of greater than 30 ohms and less than 50 ohms.

3. The phase shifter bit of claim 2 wherein the coupled line segment has a coupling of $-5\frac{1}{2}$ db and a characteristic impedance of 40 ohms.

4. The phase shifter bit of claim 2 wherein a first bias voltage is applied to the bias ports of the first input FET and the first output FET, and a second bias voltage is applied to the bias ports of the second input FET and the second output FET.

5. The phase shifter bit of claim 4 wherein when the first bias voltage is zero volts and the second bias voltage is a selected negative voltage, the RF input signal will travel through the coupled line segment.

6. The phase shifter bit of claim 5 wherein the second bias voltage is $-5\frac{1}{2}$ volts.

7. The phase shifter bit of claim 4 wherein when the first bias voltage is a selected negative voltage and the second bias voltage is zero volts, the RF input signal will travel through the pi network.

8. The phase shifter bit of claim 7 wherein the first bias voltage is $-5\frac{1}{2}$ volts.

9. A 180° phase shifter bit operable independently of input signal frequency over a predetermined bandwidth of interest to produce a 180° phase shifted RF output signal, comprising:

(a) an RF input terminal;
(b) an RF output terminal;

(c) a coupled line segment of two coupled lines having a coupling of $-5\frac{1}{2}$ db and a characteristic impedance of 40 ohms with opposed ends of each line of the coupled line segment being connected respectively to the RF input signal and the RF output signal with the other end of each line being grounded;

(d) a pi network transmission line segment having a central line portion having opposed ends from which extend grounded line portions and the opposed ends of the central line portion are respectively connected to the RF input terminal and the RF output terminal;

(e) a first input FET having a gate, a source and a drain, the first input FET connecting the RF input terminal to the coupled line segment, the gate of the first input FET being connected to a bias port, one of the drain and the source of the first input FET being connected to the RF input terminal, and the other of the drain and the source of the first input FET being connected to the coupled line segment;

(f) a second input FET having a gate, a source and a drain, the second input FET connecting the RF input terminal to the pi network segment, the gate of the second input FET being connected to a bias port, one of the drain and the source of the second input FET being connected to the RF input terminal and the other of the drain and the source of the second input FET being connected to the pi network segment;

(g) a first output FET having a gate, a source and a drain, the first output FET connecting the RF output terminal to the coupled line segment, the gate of the first output FET being connected to a bias port, one of the drain and the source of the first output FET being connected to the RF output terminal, and the other of the drain and the source of the first output FET being connected to the coupled line segment; and (h) a second output FET having a gate, a source and drain, the second output FET connecting the RF output terminal to the pi network segment, the gate of the second output FET being connected to a bias port, one of the drain and the source of the second output FET being connected to the RF output terminal, and the other of the drain and the source of the second output FET being connected to the pin network segment;

wherein a first bias voltage is applied to the bias ports of the first input FET and the first output FET, and a second bias voltage is applied to the bias ports of the second input FET and the second output FET such that the RF input signal is switched through one of the pi network segment and the coupled line segment by selected appropriate first bias voltage values and second bias voltage values and further wherein the input FETs and the output FETs have a capacitance such that a portion of the RF input signal will travel through one of the pi network segment and the coupled line segment when the RF input signal is switched through the other of the pi network segment and the coupled line segment.

\* \* \* \* \*